United States Patent [19]

Baum et al.

[11] 4,449,576

[45] May 22, 1984

[54] HEAT-PRODUCING ELEMENTS WITH HEAT PIPES

[75] Inventors: Walter Baum, Hanover; Michael Still, Langenhagen; Erich Becker, Seeheim-Jugenheim, all of Fed. Rep. of Germany

[73] Assignee: Kabel- und Metallwerke, Hanover, Fed. Rep. of Germany

[21] Appl. No.: 325,574

[22] Filed: Nov. 27, 1981

[30] Foreign Application Priority Data

Nov. 25, 1980 [DE]  Fed. Rep. of Germany ....... 3044314

[51] Int. Cl.³ ...................... F28D 15/00; H01L 23/42
[52] U.S. Cl. ......................... 165/104.33; 165/104.14; 361/385; 361/382; 357/82
[58] Field of Search ...................... 165/104.33, 104.14; 361/385, 381, 382; 357/82; 336/57

[56] References Cited

U.S. PATENT DOCUMENTS 3,971,435  7/1976  Peck ................................ 361/382 X
4,155,402  5/1979  Just .

FOREIGN PATENT DOCUMENTS 54-10464  1/1979  Japan .............................. 165/104.14
54-26556  2/1979  Japan .............................. 165/104.33

Primary Examiner—Albert W. Davis, Jr.
Attorney, Agent, or Firm—Ralf H. Siegemund

[57] ABSTRACT

The PC-boards are contained in sealed enclosures, and serially effective heat pipe systems conduct thermal energy from the respective sources of development (e.g., power transmitters) to the top and from there to a heat pump system. Stacking such units and operating the heat transfer partially in parallel is disclosed.

10 Claims, 2 Drawing Figures

HEAT-PRODUCING ELEMENTS WITH HEAT PIPES

BACKGROUND OF THE INVENTION

The present invention relates to a case, housing, or the like, for receiving PC-boards carrying heat-producing electric and electronic components. Cases, housings, covered frames, or similar kinds of enclosures, to which the invention pertains, are usually constructed to receive and hold such PC-boards, the latter being equipped for plug-in in a terminal board which is also mounted in the case. These enclosures are widely in use in computer-, control- and telecommunication-engineering. Aside from just mounting and positioning the PC-boards in an organized fashion, the enclosures provide additionally protection against dirt and dust.

Mounting a multitude of electronic and electric components in a rather dense and compact assembly inside an enclosure has the disadvantage that the heat developed by the components is, in fact, trapped. It was found that their life is, indeed, sharply reduced. Thus, it was necessary to select a sufficiently low component density in order to avoid excessive heating. In the case of a large piece of equipment, the resulting volume of component occupancy becomes quite high.

DESCRIPTION OF THE INVENTION

It is an object of the present invention to provide an enclosure for electric and electronic components permitting a higher package density.

It is a particular object and feature of the present invention to provide a new and improved enclosure, arranged for the removal of thermal energy developed during the operation of densely packaged electrical and electronic components.

In accordance with the preferred embodiment of the present invention, it is suggested to provide such an enclosure as an air-tightly sealed compartment and to use heat pipes with an evaporating working fluid in order to conduct, e.g., from a source of development, such as a lossy component, to the wall structure of the enclosure and to remove heat from there externally. The compartment wall, which serves as heat sink for the internally operating pipe or pipes, may itself constitute a heat pipe system by means of internal ducts. Also, that wall may be a slanted top. A heat pipe with working fluid will conduct heat from that top to a heat pump. Other enclosures of like configuration may be stacked one on top of the other, and all conduct heat by means of such heat pipes to a common heat pump that may sit on top of the stack. Heat from electrical components in the interior of an enclosure is, thus, removed through a series of heat pipe systems, each system including a separate working fluid that evaporates on the thermal "input" side and recondenses on a surface of a part that is, in effect, the input structure for the next heat pipe system. These parts are preferably made of good heat conductors (e.g., copper) so that thermal energy is not "laterally" dissipated and will not reenter the enclosure.

The enclosure or enclosure system is constructed and cooperates with the heat pump to maintain the temperature within a comfortable range; too cold a temperature must be avoided also. The connections of heat pipes are preferably provided through plates serving as heat sinks or heat receptors for the fluid in the piping or tubing, and these plates are in a broad surface-to-surface contact with other parts in order to obtain a step-by-step removal of heat from the entire system, beginning with individual collection from all heat sources, such as power transistors, thyristors, lasers, etc. One can also say that there is a plurality of serial effective heat pipe systems, and each system is per se composed of several parallel operating heat pipes.

If for any reason a "weak spot" exists in the conduction of thermal energy, it may be advisable to place a peltier element at that location and operate the same to, thereby, offset and, possibly, eliminate the resultant local temperature gradient or even jump.

DESCRIPTION OF THE DRAWINGS

While the specification concludes with claims, particularly pointing out and distinctly claiming the subject matter which is regarded as the invention, it is believed that the invention, the objects and features of the invention, and further objects, features and advantages thereof, will be better understood from the following description taken in connection with the accompanying drawings, in which:

Proceeding now to the detailed description of the drawings, FIG. 1 illustrates a stack 1 of enclosures 10a, 10b, 10c, 10d, and 10e, each one being a self-contained and mechanically self-supporting unit of similar design and defining a compartment for PC-boards. A top unit 11 is dimensionally similar to the others, but will differ functionally, as will be described. The various stacked units are cut away differently in the illustration and show different states or degrees of "loading" with PC-boards in order to facilitate the description. Unit 10a is shown completely empty, and unit 10e is shown just from the outside.

Figure 1:
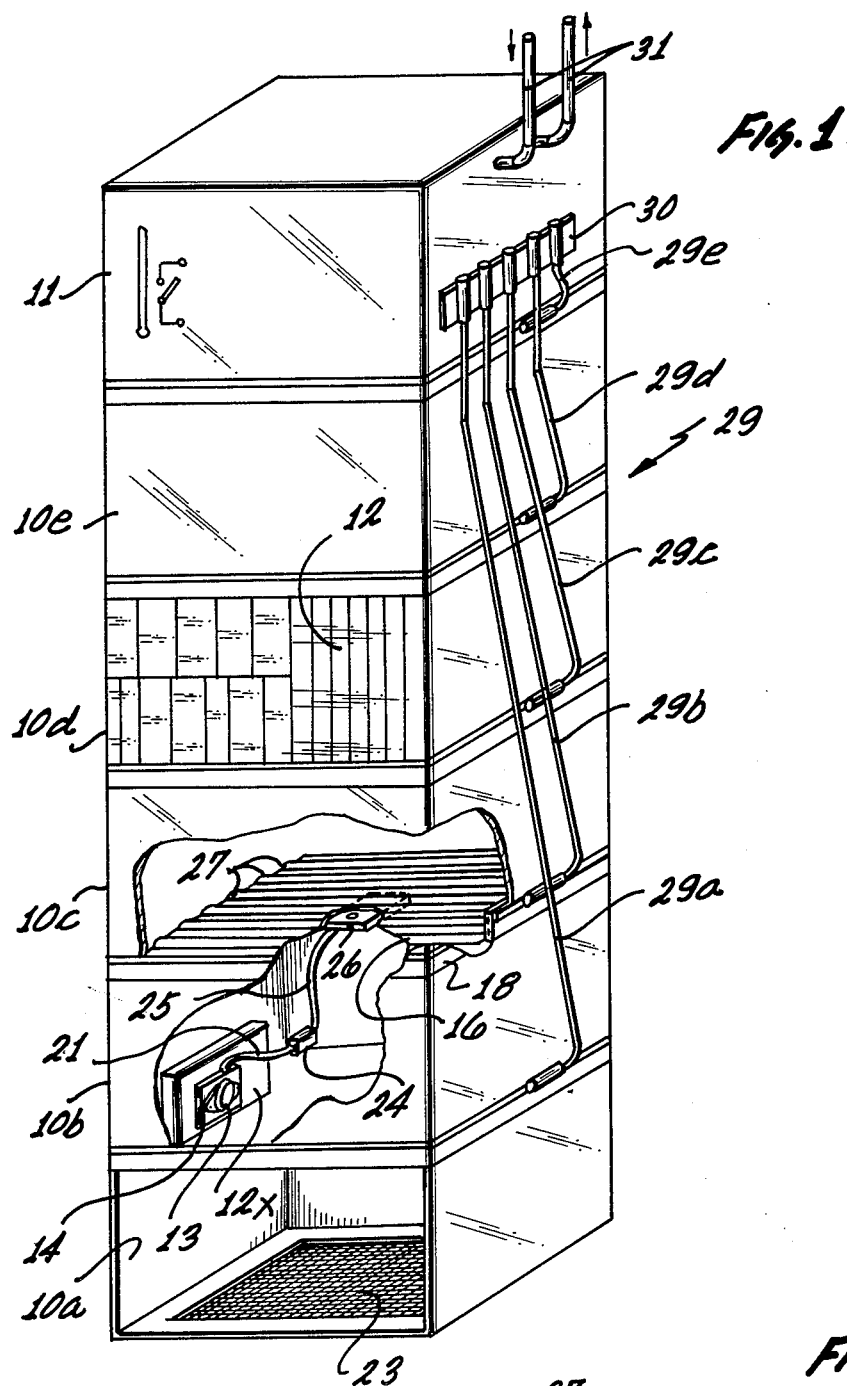
FIG. 1 is a perspective view of and into a stack of enclosures constructed and combined in accordance with the preferred embodiment of the invention for practicing the best mode thereof.

A side wall has been "removed" from unit 10d for illustrative purposes, to show schematically that the normal content of each enclosure unit is a plurality of PC-boards 12, placed in suitable rack structures of an interior frame of each unit. The frame of an enclosure unit may be divided into portions which hold regular standarized cards, while other portions hold twin-size cards. Each enclosure consists essentially of three side walls, a bottom and a top wall, to be described more fully below. Additionally, each unit has a removable front panel which may be bolted or otherwise removably affixed to the enclosure walls in general. The installation of the front panel is to be made in a sealing, airtight fashion so that the compartment of the unit is sealed. The compartments are preferably filled with an inert gas, such as argon.

As shown specifically for unit 10b, a particular card 12x holds, among other components, a power transistor 13. That transistor may be specifically mounted on a heat sink, such as a copper plate 14. This particular power-consuming element is just one of, possibly, many in the stack. Other typical power units are thyristors, lasers, possibly also transformers or other inductance coils; i.e., any kind of components which are passed through by a significant electric current. Now, in accordance with the invention, that plate is coupled in temperature-conductive relation to a heat pipe or hose 21.

That pipe or tube contains a fluid which evaporates at a low temperature. The interior of pipe 21 is in a good heat-conductive relation with the heat sink 14 of the power element 13 so that that heat can be speedily converted into latent heat of evaporation of the working fluid. In particular, the heat transfer to the working fluid must be significantly easier than the heat dissipation from heat sink 14 (or element 13 as a whole) into the environment.

Pipe 21 may be relatively short, and it is envisioned that it comes, so to speak, with the power transistor. In other words, components which are prone to develop excessive or relatively large amounts of heat may be equipped with a thermo-conductive connection to a heat pipe, such as pipe 21.

A coupler 24 connects that pipe 21 to another one (25), which has its other end permanently connected to a copper plate 16. That plate 16 constitutes a portion of the top or roof structure of the enclosure unit. The pipe or tube 25 may actually be directly connected to a thermal fan-out plate 26 in order to obtain a good heat conduction from the interior of pipe 25 to the copper plate 16. The plate 26 serves as a condensation surface to cause the evaporated working fluid in tubes 15-25 to recondense, thereby yielding its latent heat of evaporation which is absorbed by plate 26 and transmitted to plate 16. These parts are made, e.g., of copper to provide for good thermal conduction of heat out of the compartment of the respective unit.

The pipes 21 and 25 together with coupler 24 may constitute a complete, self-contained system; i.e., it is sealed and contains the working fluid as mentioned above, but does not fluid-conductively communicate with any other pipe system. The heat pipe system 21-24-25 is made of a piping or tubing which by and in itself conducts heat so that any heating of the interior of the compartment is also conducted to the working fluid. The top plate 16 is also exposed to any convective flow inside the compartment and participates as such in the removal of residual heat.

For reasons of good thermal conduction, pipes 21 and 25 are preferably made of metal. It is advisable, however, to provide for electrical insulation if utilization of the tubing for grounding purposes is not desired or possible, e.g., because the sink of the power transistor is not at ground potential. In these and other cases, coupler 24 is made of an electrically insulating material.

Figure 2:
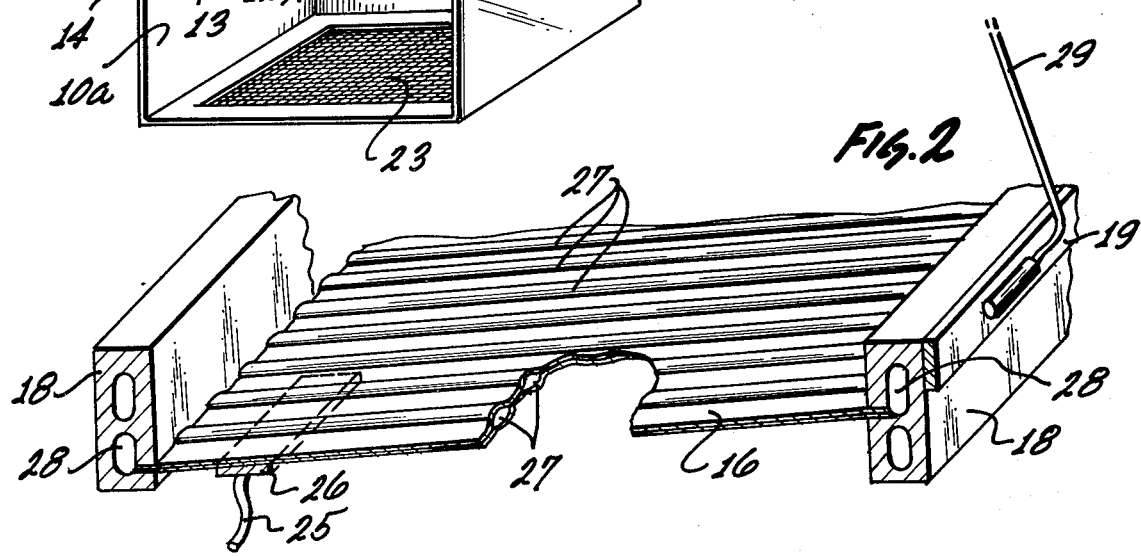
FIG. 2 illustrates a detail of the stack and involving particularly the top structure of one enclosure unit of that stack.

The roof or top structure of a unit is illustrated in greater detail in FIG. 2. It includes, as stated, a plate 16 which contains a plurality of parallel-extending channels or ducts 27. This plate is made of copper, and the ducts 27 are preferably worked into the plate in integral fashion in order to avoid any unnecessary discontinuity in the heat transfer into and through the plate, particularly into the ducts 27.

The ducts 27 contain also a working fluid of the type described. That fluid is, of course, in good heat-conductive relation with the material of plate 16 which, in turn, is heated by the various plates, such as 26, by means of which heat is transported from the various heat-producing components within the unit. The fluid in the ducts 27 may be the same as in heat pipe 21, upper rating, however, with a higher boiling point.

The roof or top structure of a unit includes side bars 18 which are section pieces and constitute the top rim of the unit in which the top 16 is held. The rim sections 18 are traversed by, e.g., two bores, such as 28. One of these bores 28 may be closed and contain also working fluids, possibly a fluid with a lower boiling point. Such a bore may, thus, constitute a separate and individual portion of another heat tube system. The second one of each set of bores is fluid-conductively connected to the bores 27 and serves, thus, as a manifold. The two bores in each rim element 18 could be interconnected. The rim elements 18 serve also as spacers with rectangular cross sections onto which one stacks the next unit in the assembly 1.

The bars or sections 18, or just one per enclosure unit, is provided with a thermal coupler plate 19 on which terminates a pipe or tube, such as 29 in FIG. 2, there being four such pipes 29a, 29b, 29c, 29d, and 29e which extend respectively from the top of the five units 10a to 10e, up to a similar connecting or coupler plate 30 on unit 11. The coupler plate 19 in each instance serves as a collector for the heat that has been transmitted from ducts 27 into bores 28 and has heated the respective rim element 18. Each pipe 29 is again partially filled with working fluid and constitutes a component in another heat tube system. Pipes 29 contain the same working fluid.

The upper unit 11 contains a heat pump which is heat-conductively connected to the collector bar 30 and provides, so to speak, the low temperature end of a temperature gradient. Particularly the heat pump will actively maintain the temperature of bar 30 at a temperature of just above the dew point of the surrounding atmosphere (being at a room temperature). This lower temperature limit is chosen to avoid the formation of condensation water anywhere in the system. On the other hand, upon actively maintaining bar 30 at that temperature, the very efficient heat conduction by the various, serially operating heat tube systems rapidly removes thermal energy from the various electrical components in the stack. The heat pump itself is connected to a pipe system 31 by means of which the removed thermal energy is transported elsewhere for beneficial use. For example, system 31 may be a part of a hot-water system.

If the ambient temperature drops below 20° C., the control of the heat pump is interrupted so that one can operate the system in an unheated environment. The heat transport to the bar 30, from which it is dissipated, will suffice.

In order to obtain a narrow temperature range within which to operate the system, each unit may be provided with a heating foil such as 24 which will, in fact, heat the interior of a unit whenever the temperature therein drops below desirable values. A simple thermoswitch may provide for this control. Heating such a unit may be desirable when the ambient temperature drops to the freezing point in order to prevent the formation of tin pest.

The particular heat pump unit 11 as top unit of a stack is shown here to demonstrate a complete system. In reality, one may use several stacks, each having just a top plate or the like, and all of these plates are heat-conductively connected to a heat pump, being on top of one stack or elsewhere, and by means of another heat tube system.

FIG. 2 shows that the top 16 of a unit should be mounted in a slanted position, and the various heat tube systems which extend from and into the interior of the compartment should be coupled (plate 26) to the lower portion of top plate 16 which is, generally, on the left-hand side of the plate. The recondensed working fluid inside ducts 27 will, thus, flow toward that lower end of the respective duct, right to the area to which heat is conducted by the interior heat tube system. Evaporated working fluid will flow into a bore 28 of the rim 18 holding the upper end of plate 16 and will recondense in that rim element which, in turn, transports the heat thus received to coupler plate 19.

Each unit is encapsulated, i.e., air-tightly sealed and filled with a protective gas (e.g., argon) atmosphere in order to avoid any oxidation of the components which further increases their life. The units can be separated from each other simply by decoupling the respective pipe 29, e.g., from the respective rim section 18 and coupler plate 19; a plurality of such pipes 29 may be part of a permanent installation of a heat pump unit, such as 11, they extend down from the collector bar 30 of that unit.

The device, as described, exhibits a number of advantages. The enclosure units may be constructed as slide-in devices, one above the other, and a large-scale frame construction is not necessary. The enclosure may be stacked up to a height of 7' to 8' and may be placed alongside a wall or back-to-back. All enclosures have a front panel which is air-tightly sealed to the remainder of the enclosure so that, as stated, each unit can be filled with a protective (inert) gas. The automatic heat removal permits the stack to be placed in a nonairconditioned room. Since the heat removal is very effective and individualized as to the principal heat sources, one can readily mount the components in a much denser assembly. The primary heat removal is carried out by the direct contact of a heat pipe with the source, such as the heat sink mount of a power element. However, the pipe (21, 25) itself serves as a heat exchanger (sink), and the copper top 16 readily absorbs heat rising inside the enclosure. In view of the effective cooling, the stack of units can be placed where needed, not where it is cool.

Wherever there appears a local "weak" spot in the heat transfer, one may interpose a peltier element which, in effect, eliminates any temperature gradient (or even interposes one) of favorable direction as far as the heat transport out of the compartmens is concerned. Such a peltier element may, for example, be interposed between a coupler plate, such as 26, and the top structure because the interior of the compartments is the most sensitive portion in the system.

The invention is not limited to the embodiments described above; but all changes and modifications thereof, not constituing departures from the spirit and scope of the invention, are intended to be included.

We claim:

1. An enclosure for receiving PC-boards, of which one or more carry at least one electric or electronic power element that develops significant amounts of heat, comprising:
    the enclosure being air-tightly sealed, and having a top, there being ducts in the top filled with an evaporating working fluid;
    first means including a working fluid containing tubular or hollow means disposed for conducting thermal energy from the interior of the enclosure to said top; and
    second means coupled to the top outside said enclosure for removing said conductive thermal energy.

2. An enclosure for receiving PC-boards, of which one or more carry at least one electric or electronic power element that develops significant amounts of heat, comprising:
    the enclosure being air-tightly sealed, and having a top, there being ducts in the top filled with an evaporating working fluid;
    a tubular, evaporating working fluid containing heat conductor thermally coupled with one end to said power element and for said top with its other end and conducting heat to the top of said enclosure and
    means disposed for removing said heat from said top.

3. An enclosure for receiving PC-boards, of which one or more carry at least one electric or electronic power element that develops significant amounts of heat, comprising:
    the enclosure being air-tightly sealed, and having a top, there being ducts in the top filled with an evaporating working fluid,
    first means, including tubular means in the enclosure in heat-conductive relation with the element and with said top and including an evaporating fluid;
    second means in heat-conductive relation with said fluid in said top when evaporated and being at or part of a wall of the enclosure, the fluid recondensation in the ducts or the top when in contact with the second means, thereby heating the second means; and
    means on the outside of the enclosure for removing heat from the second means.

4. An enclosure for receiving PC-boards, of which one or more carry at least one electric or electronic power element that develops significant amounts of heat, comprising:
    the enclosure being air-tightly sealed;
    the enclosure having a top, therein being ducts in the top filled with an evaporating working fluid;
    at least one tubular means in heat-conductive relation with the element and with said top and also containing an evaporating working fluid; and
    means for removing heat from recondensed working fluid in said ducts.

5. An enclosure as in claim 4, the top being inclined.

6. An enclosure as in claim 4 or 5, the means for removing including a heat sink element and another tube filled with working fluid, all outside said enclosure.

7. An enclosure as in claim 4, the means for removing including a bored section, and heat tubing means connected to said section.

8. An enclosure as in claim 7, the section having at least one bore communicating with the ducts in the top.

9. An enclosure as in claim 1, 2, 3 or 4, the means for removing including a heat pump system.

10. A plurality of units as in claim 1, 2, 3 or 4 and including a common means for heat removal.

* * * * *